(12) United States Patent
Kocher

(10) Patent No.: US 6,292,004 B1
(45) Date of Patent: Sep. 18, 2001

(54) UNIVERSAL GRID INTERFACE

(76) Inventor: Douglas Kocher, 9755 SW. Commercial Cir., Wilsonville, OR (US) 97070

(*) Notice: Subject to any disclaimer, the term of this patent is extended or adjusted under 35 U.S.C. 154(b) by 0 days.

(21) Appl. No.: 09/298,270

(22) Filed: Apr. 23, 1999

(51) Int. Cl.$^7$ ..................................................... G01R 31/02
(52) U.S. Cl. ............................................................ 324/754
(58) Field of Search ................................. 324/761, 537, 324/538, 754, 755, 758, 765

(56) References Cited

U.S. PATENT DOCUMENTS

| | | |
|---|---|---|
| 5,399,982 | 3/1995 | Driller et al. . |
| 5,559,445 | 9/1996 | Eaddy et al. . |
| 5,633,598 | 5/1997 | Van Loan et al. . |
| 5,688,127 | 11/1997 | Staab et al. . |
| 5,764,069 | * 6/1998 | Cugini .................. 324/761 |
| 5,798,654 | 8/1998 | Van Loan et al. . |

* cited by examiner

Primary Examiner—Safet Metjahic
Assistant Examiner—J. Kerveros
(74) Attorney, Agent, or Firm—Ipsolon LLP

(57) ABSTRACT

A grid test fixture for electrically testing both bare and loaded printed circuit boards incorporating IC components having high densities and fine pitch electrical test points. The fixture uses a universal grid interface to translate the image pattern associated with selected test points on the board, which are not always in a regular grid array, into the regular grid pattern associated with the test equipment. The universal grid interface is used in combination with standard test fixture components. Test probes arranged in the image pattern of selected test points are oriented in the universal grid interface such that they make electrical contact with associated contact points on a flex, which also are arranged in the image pattern. The flex translates the image pattern into the grid pattern at a location remote from the location of the selected test points on the board. The interface is removable from the test fixture and may be used to translate any component having the same pitch as the holes in a receiving block built for the interface.

22 Claims, 5 Drawing Sheets

UNIVERSAL GRID INTERFACE

FIELD OF THE INVENTION

This invention relates to test fixtures used in the process of testing and verifying the operation of bare and loaded printed circuit boards, and more specifically to a test fixture utilizing a removable universal interface adaptable to test boards and components having high densities and fine pitches.

BACKGROUND AND SUMMARY OF THE INVENTION

Grid test fixtures, also commonly known as "grid translator fixtures," are used in conjunction with automated, computer-based testing equipment to test and verify the functioning of both bare printed circuit boards and loaded boards. The testing routines ensure that the boards are electrically and physically correct, and that they meet specifications. Comprehensive board testing is necessary since loading complex and expensive components onto a partially tested or defective bare board can be very costly. For bare circuit boards the goal of the board testing and verification process is 100% fault coverage in the electrical network or net list. Since one side of a board usually has a different array of electrical contacts from the other side of the board, both sides of a bare board must be tested. Loaded circuit boards, on the other hand, do not require 100% fault testing of the net since the bare board should have already been tested, and the components that are loaded onto the board also will have been tested. However, loaded boards do require that a significant testing routing be followed to ensure compliance with standards for the board and that, for instance, all soldering has been done to specification.

The test fixtures of interest in the present invention are adapted to test both bare boards and boards that have been loaded with electrical and/or electronic components. But regardless of whether a bare or loaded board is being tested, the test fixture serves as a structural framework that facilitates the establishment of an electrical connection between test points on the circuit board being tested on the one hand, and the testing equipment on the other hand. This is done by electrically interfacing the test equipment with test points on the board through a plurality of test pins that probe specific contacts on the board, one test probe for each test point. The "test points" thus are the electrical contacts, via holes or plated through holes on a bare circuit board that require testing, or the contacts found on a board that has been loaded with components and which require testing.

As is standard in the industry, the test points on a circuit board are irregularly arranged and spaced, depending upon such factors as the physical size of the board, and the type, number and spacing of components that are to be used with the board. In contrast, the test equipment used to test the boards has test contacts arranged in a regular grid array. The spacing of the test contacts in the grid array varies according to the manufacturer and model of the test equipment. Regardless of the spacing of the regularly spaced test contacts in the grid array, the test fixture therefore serves to "translate" the irregular array of test points on the circuit board into the regular grid array of the test equipment.

The number of points to be tested on any given circuit board can be quite large, numbering in the thousands. During the testing process an electrical connection is made between the each test point on the board under test and the test equipment. The test equipment transfers signals through switched circuits to selected and predetermined test points or circuits on the circuit board that is being tested, and a pass, no pass result is obtained. In this way the proper functioning of the entire net of circuits on a board—the so-called net list—can be checked and verified. Faults in the board are also readily identified.

Grid test fixtures are uniquely designed for each specific board design. The test fixture typically includes a top plate and a bottom plate and series of parallel, spaced apart guide plates arranged in a stacked fashion between the top and bottom plates. Each plate in the test fixture has a plurality of test probe holes drilled through it in a predetermined array pattern that corresponds to the array pattern of test points on the circuit board to be tested. Again, the pattern or array of test points varies widely from board to board. For instance, one board might have tens of thousands of test points that are entirely or partially grid-oriented. Another board might be adapted for an entirely different set of components with only several hundred test points spaced irregularly around the board.

The center-to-center distance between test points in a given component is referred to as "pitch." With some integrated circuit (IC) components the pitch is very fine. As an example, in some component packages such as ball grid array (BGA) packages and chip scale packages (CSP)—package referring to the I/O packaging for the die—the pitch may be less than 1 millimeter, and down to 0.2 mm. A bare board adapted for utilizing such a package has a component mounting location with connecting holes (i.e., vias) having the same pitch. The "density" of a package or a board refers to the number of test points per unit area in the package, or the component mounting location on the board. Current densities may be up to 900 test points in an area of 35 $mm^2$ for some IC packages, and the density of packages is constantly increasing. The pattern of test points in either a bare board as a whole, a component mounting location on a bare board, or in a single component is referred to herein as the "image pattern." The image pattern is specific to the board under test or to a component. Since there are many, many different components, and of those, many different pitches and densities, the image pattern varies according to the specific component or component mounting location on a board.

In contrast to the variable image pattern of test points on the board under test, the test equipment, as noted, has a regularly arranged grid pattern of test contacts. This regular grid pattern is a result of various factors, including the fact that spring probe connections are used to interface the test machine contacts to test probes in the test fixture, and these introduce certain physical limitations on contact spacing. In addition, since the electrical connections on switch cards have certain standard dimensions, these limitations also effect the spacing of contacts on the test machine. Due to these and other factors, on most commercially available test equipment the test contacts or connecting points are provided in, for instance, a regular grid having ten contacts per inch, one hundred test contacts per square inch. Some test equipment has been built with up to double this number of test points per inch, but no equipment has a grid pattern density that approaches the density and pitch of, for example, BGA and CSP packages. Thus, the distance between adjacent test contacts found on the test equipment is nearly always greater than the pitch of components to be tested.

The test fixture facilitates an electrical interface between the test points in the image pattern of the board under test, and the regular "grid pattern" of the test contacts of the test equipment. This interface is accomplished with test probes, also called "test pins" or "translator pins," that extend through the test probe holes drilled through the plates in the test fixture. The test probes are used to establish electrical contact between the test points on the circuit board on one side of the test fixture, and associated switches interconnecting the probes to the test equipment on the opposite side of the test fixture. Standard test probes are around 3¾ inches in length. The diameter of the probes varies according to the type and size of the test point that the probe will contact. The test probes extend completely through the test fixture. One end of the probes is connected to the test equipment and the other end probes a test point on the board under test. In this way an electrical connection may be made with the test probe making contact with a test point on the board on one side of the fixture, and a corresponding test point on the test machine on the other side of the fixture.

Because the image pattern is different from the grid pattern, translation of the image pattern requires that many of the test probes are oriented in the test fixture at oblique angles relative to the plane of the test fixture. This is referred to as test probe tilt or lean. The test probe holes drilled through any one plate in the test fixture thus will be in a slightly different position from the corresponding test probe holes drilled through the next adjacent plate.

Given the many thousands of test probes that may be included in a test fixture, the positioning of the test probe holes drilled through the plates must be precisely controlled. But as IC packaging gets smaller, and as pitch distances get smaller and test point density increases, limitations in standard test fixtures become apparent. For instance, translating the image pattern from a single CSP or BGA mounting location to the grid pattern requires that a test probe for each test point in the image pattern be translated to the grid pattern, with its standard ten points per inch spacing. This requires complex physical spacing of the test probes within the test fixture. The test probe holes drilled through each successive plate in the test fixture must be precisely controlled since if the probes are in electrical contact with one another, errors will be introduced into the testing regimen. Further, since the test probes are manually loaded into the test fixture, loading becomes increasingly difficult. Since test probes are of standard length, the pin tilt angle is very limited. And finally, when the pitch of an IC package decreases below a certain point it becomes physically impossible to translate with standard test fixtures all of the test points on the component to the grid pattern of the test machine.

As is evident from the foregoing discussion, a major consideration to be addressed in designing a test fixture is translating the image pattern of the board under test to the grid pattern of the test equipment. When a board has many components such as BGA, CSP and other packages, and those components are tightly packed onto the board, the problem becomes how to accomplish this translation.

Various solutions to the problems of testing increasingly miniaturized IC packages with higher densities have been proposed and tried. For instance, one solution is to build multiple test fixtures for testing different components or net lists of the same board. Since most boards have multiple IC components, and of those, many are different from one another (for instance, BGA, CSP, etc), multiple traditional test fixtures are built, with each different fixture intended to test a specific portion of the net list in the board. This solution has several problems. First, it is impossible to obtain a truly 100% fault coverage test since it is possible for there to be open and short circuits in the board that are not tested and which go undetected. In other words, regardless of how the testing is carried out, unless all test points on the entire board are tested with a single fixture and single test cycle, it is possible for there to be undetected faulty circuits. Further, building multiple fixtures is expensive, labor intensive and time consuming.

Another solution is to increase the length of the test probes to increase the degree of angular deflection that the probes may be held in the test fixtures. While this allows translation of higher density test points, there still is a limit to the density and pitch that may be translated in this manner. In addition, as the degree of pin tilt increases, there is a greater chance of poor electrical connections with the test machine interconnects. This introduces opportunity for error. There are also substantial physical limitations placed on circuit board designers in the placement of components relative to one another that affect the test fixture that will be designed to test the board.

One further solution is to assemble a sub-test fixture to test a specific component or a portion of a board outside of the test fixture itself. Such a separate sub-test fixture uses a plurality of wires to interconnect each point of the circuit under test into the grid pattern. This solution has many obvious limitations, the most major of which is the limitation described above relative to the inability to test the entire board under test at one time in one cycle. There are other limitations with sub-test fixtures as well, including the fact that it is very difficult to insure the correct electrical connections are made between the test points and the correct associated test point on the test machine when many hundreds of wires are used.

Yet another solution to the problem of translating the image pattern into the grid pattern of test machines is described in U.S. Pat. No. 5,399,982. This invention relies upon a flexible adapter foil that is used in a test fixture and carries on the side facing the grid pattern regularly arranged leads, and on the side facing the component under test leads that are directly in electrical contact with the test points of the component. The mutually assigned leads are electrically interconnected on both sides of the flexible adapter by plated-through holes and, if needed, associated printed conductors.

Despite the improvements made to test fixtures there remains a need for test fixtures that can interface all test points on a board, regardless of the components used on the board and regardless of the density and pitch of the test points.

The present invention approaches the problems associated with translating the image pattern of a board under test—or portions of it—to the grid pattern of the test equipment in a new manner, with a universal grid interface (UGI). The UGI of the present invention is often used as a part of a standard test fixture that uses traditional test probes. However, the UGI is utilized where component spacing or density or other limitations dictates that traditional test probe techniques cannot be used, for instance where multiple CSP or BGA packages are oriented adjacent one another on the board. The UGI allows one or more new grid patterns to be placed within the existing test fixture independent of the grid pattern of the test machine.

The UGI uses test probes that are generally arranged in the test fixture in the image pattern, and which generally do not vary from that pattern. These test probes extend into the test fixture in the image pattern and, in one aspect of the invention, are electrically interfaced with associated test points in the test machine through the use of a flexible circuit interconnect that has a pad having electrical contacts that are arranged in the image pattern on one end. Such flexible circuit interconnect material is commonly called "flex." The test probes make electrical contact with the associated contacts on the pad of the flex. The flex may be folded onto itself and threaded in a ribbon-like manner through other test probes in the test fixture and extended to a location outside of the fixture or image of the board. Since the flex is electrically shielded, the flex may make physical contact with other test probes in the fixture without interfering with test signals. The electrical leads or traces in the flex may then be translated into the grid pattern of the test machine at the opposite end of the flex. The use of flex thus allows the electrical test points of the board to be interfaced with the test machine without physically interfering with other test probes in the test fixture.

The UGI may be used in test fixtures that are otherwise conventional, but which include components such as CSP or BGA packages that cannot be translated with conventional fixtures. Multiple UGI assemblies may be used in the same text fixture. In addition, a UGI according to the present invention may be used with a specific component in whatever type of board in which the component is used. In other words, and by way of example, each specific CSP or a CSP having the same pitch will have a unique pattern of test points, or image pattern. That particular CSP or a CSP having the same pitch might be used in many different circuit boards. A UGI built for that specific CSP or other component having the same pitch could be used with a test fixture built for many different circuit boards. Furthermore, the UGI may be used with any component having the pitch of the UGI. For example, there are many components that have a pitch of 0.3 mm. A UGI built for a 0.3 mm. pitch may be used with any component having that pitch, regardless of the specific image pattern used in that component. A UGI is thus "universal" to the CSP or other packages having the same pitch for which it is built.

DETAILED DESCRIPTION OF PREFERRED EMBODIMENTS

Background

Figure 1:
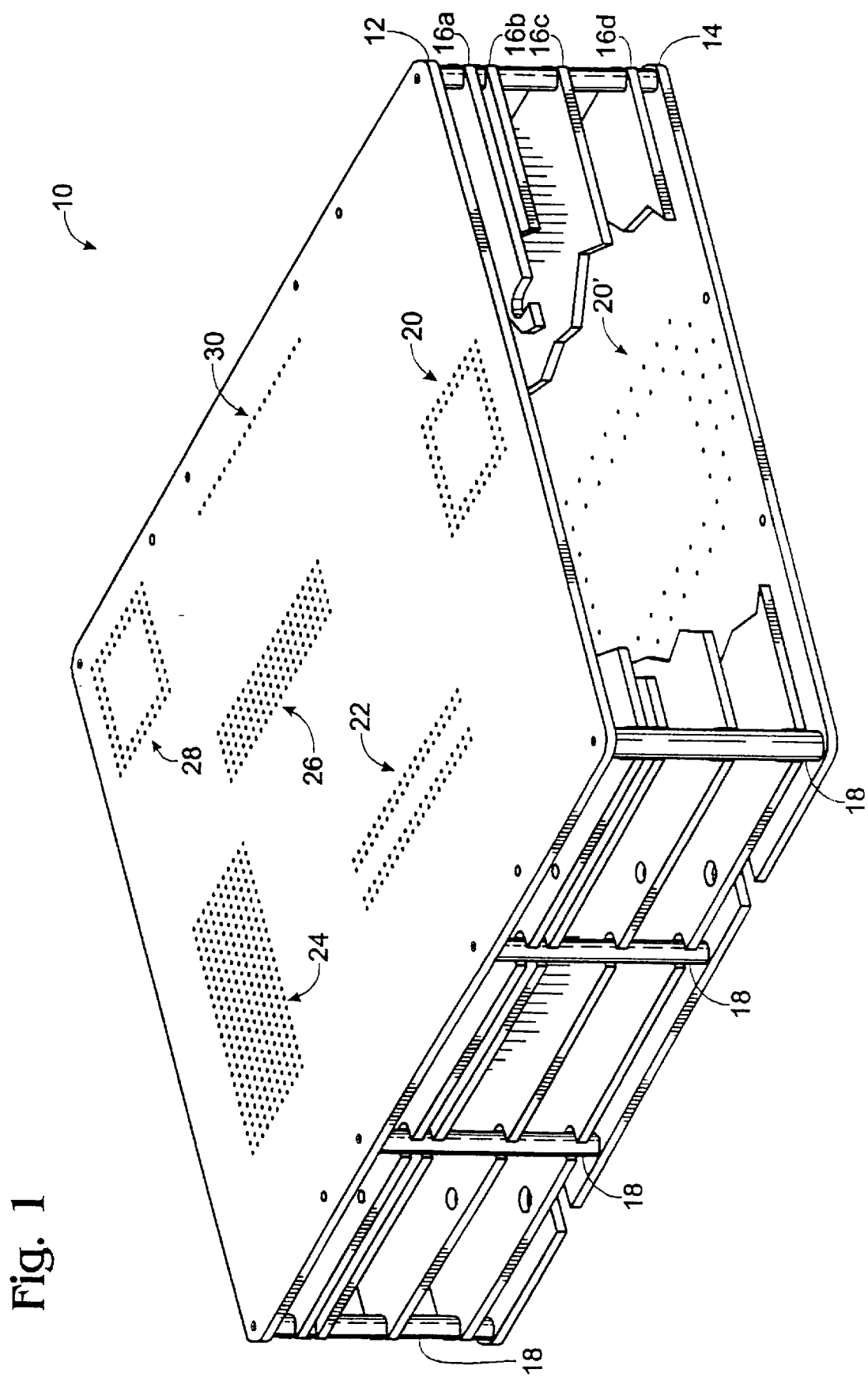
FIG. 1 is a perspective, partially cut away view of a test fixture showing test probe holes translating a top plate image pattern to a bottom plate regular grid pattern.

A standard test fixture 10, somewhat simplified for illustration purposes, is shown in FIG. 1. The test fixture 10 is made up of a series of parallel plates through which the test probes extend and which define a plate plane. The test fixture illustrated in FIG. 1 includes a top plate 12, a bottom plate 14 and a plurality of guide plates 16 (labeled 16a through 16d). The top and bottom plates and the guide plates are held in a spaced apart parallel orientation by a plurality of separator posts 18 spaced around the periphery of the test fixture. A few separator posts 18 are shown in FIG. 1. The number and positions of the separator posts varies according to the size of the test fixture. The test fixture itself is sized according to the size of the circuit board that will be tested.

The number of guide plates in a test fixture can vary, as can the distance between the guide plates. Accordingly, the position at which the guide plates are engaged by the separator posts can vary. The number and positions of the guide plates shown in the figures is for illustrative purposes only.

In practice, both the top plate 12 and the bottom plate 14 are formed of a relatively thicker, relatively more rigid material than the guide plates 16, which as noted are disposed in a parallel array between the bottom and top plates when the test fixture is assembled. All of the plates in the fixture are typically formed of a non-conducting plastic material such as Lexan, G10 or FR4 that is easily drilled.

Referring to FIG. 1, each plate in the test fixture has a plurality of test probe holes drilled through it for receiving, guiding and holding the test probes. The holes are drilled in a pattern associated with and corresponding to the pattern of the test points on a circuit board that is to be tested with the test fixture. In FIG. 1 there are a plurality of test probe hole arrays, numbered 20, 22, 24, 26, 28 and 30. Each array corresponds to the pattern of test points on a board that will be tested. For instance, array 20 might be the test probe holes associated with the test points of one specific IC package (or IC package mounting location) on the board, array 22 is the pattern associated with a different package, array 24 the pattern associated with yet another package, and so on. The holes in the top plate are drilled in a mirror image of the test points on the board under test—there is a test probe hole for each test point on the board. In other words, the arrangement of test probe holes in the top plate is a mirror image of the arrangement of test points on the circuit board under test.

As used herein, image pattern refers to the pattern or arrangement of test points on the board under test. In most instances this is the same as the pattern or arrangement of test probe holes drilled through the top plate of the fixture. Image pattern also may refer to the pattern or arrangement of a selected number of test points associated with a specific component within a board, the selected number of such test points being less than the total number of test points in the entire board, but the image pattern nonetheless matches the number and arrangement of the selected test points.

In FIG. 1 the guide plates 16a through 16d have been partially cut away to illustrate the manner in which the test probe holes in hole array 20 are traditionally translated from the image pattern on the top plate to the regular grid pattern shown on the bottom plate 14. The grid pattern of the test machine almost always has a lower density than the image pattern of the board under test. The image pattern thus almost always has a higher density than the grid pattern. As used herein, grid pattern refers to the regular array of test contacts in the test machine.

FIG. 1 illustrates that the image pattern (ie., the test probe holes in top plate 12) has a finer pitch and higher density than the grid pattern (i.e., the test probe holes in bottom plate 14). Translation of the image pattern to the grid pattern traditionally requires pin tilt. With hole array 20, not all of the test probes may be tilted relative to the horizontal test fixture plane at the same angle because one edge of the component that is represented by hole array 20 is quite near one lateral edge of the top plate. As such, the test probes located near that lateral edge of the test fixture must be closer to perpendicular than, say, the test probes located at the opposite edge of the component. Thus, the pin tilt is not only variable between components on a given board, but within a specific component. Since standard test probes are generally all of equal length and must extend through both the top and bottom plates, the degree of pin tilt is somewhat limited by the length of the probes.

The image pattern of the hole array 20 in top plate 12 is "translated" into the grid pattern of the test machine, as represented by the hole array 20' in bottom plate 14, which may be seen as being different from the image pattern. For each hole in the hole array 20 in top plate 12 there is a corresponding and associated hole in the hole array 20' in bottom plate 14. The holes in array 20, which are in the image pattern, are translated into the grid pattern in array 20' by first determining an appropriate spatial arrangement for the holes in array 20', then drilling the holes in the bottom plate in array 20' in the grid pattern spacing that corresponds to the determined arrangement. The test probes are inserted into the holes (and through associated holes in the guide plates, which are not shown). Since the holes in array 20 are more closely spaced that the holes in array 20', most of the test probes are held in the test fixture in angular orientations relative to the horizontal plane of the plates in the test fixture. This tilt of the test probes may be seen in FIG. 2, where it can be seen that a series of test probes 32 are arranged at oblique angles relative to the horizontal plane of the test fixture.

Figure 2:
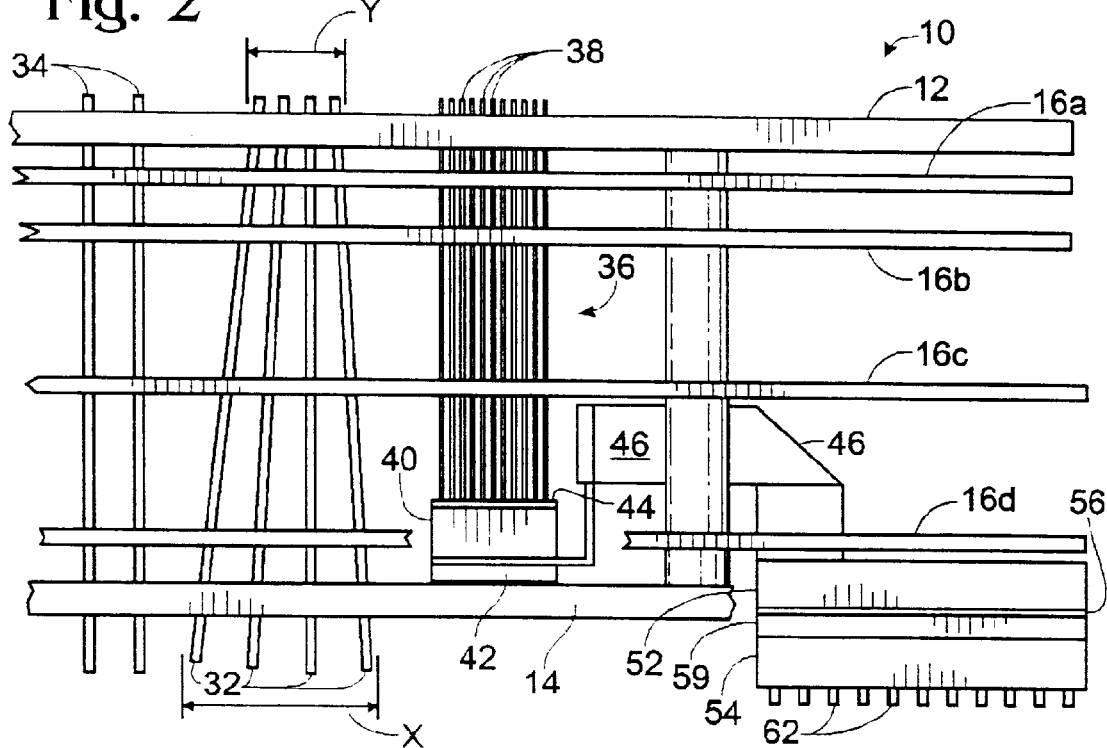
FIG. 2 is a side elevational view of a simplified test fixture showing both conventional test probes translating a top plate image pattern into a grid pattern, and a UGI according to the present invention, with a portion of the test fixture partially cut away to expose components of the UGI.
Figure 3:
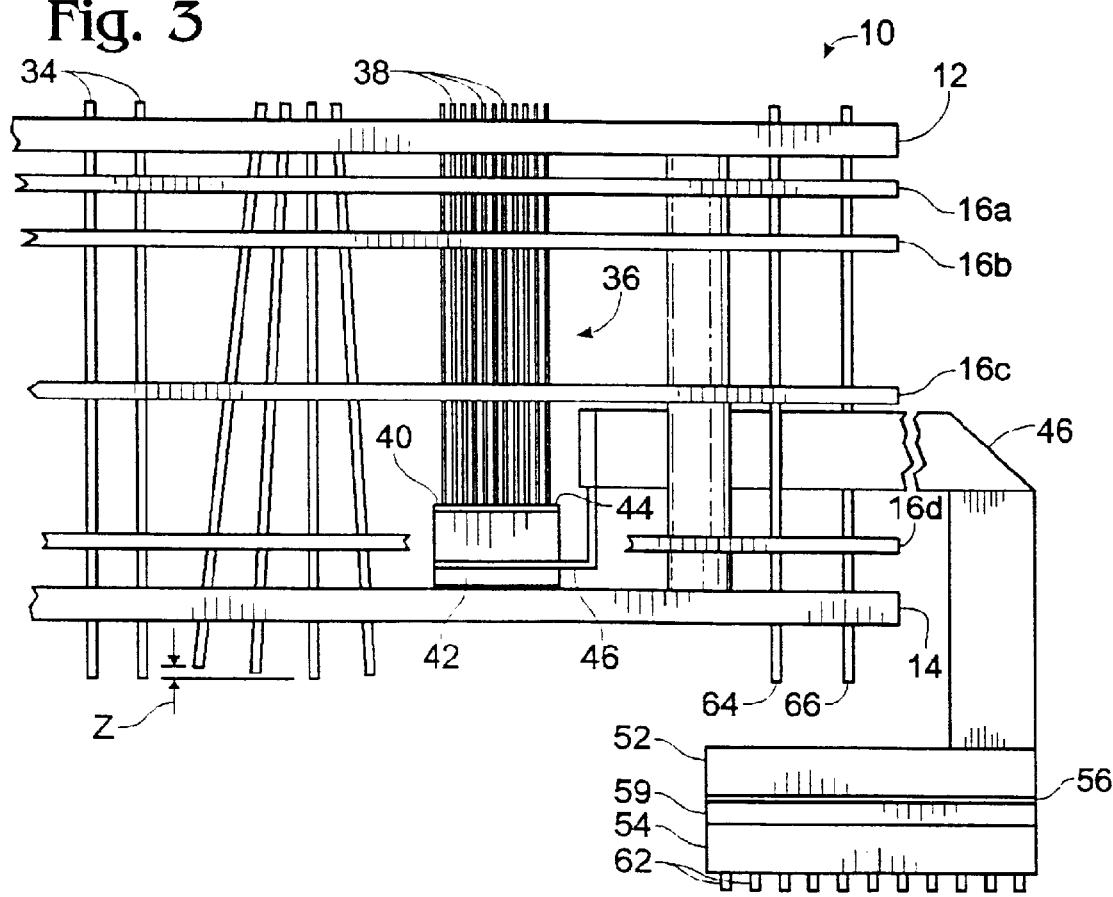
FIG. 3 is a side elevational view of a simplified test fixture showing both conventional test probes and a UGI according to the present invention, wherein the UGI translates the test points to a location remote from the test fixture, and wherein a portion of the test fixture is cut away to expose components of the UGI.

The lower distal ends of test probes 32 extending through bottom plate 14 are in the grid pattern of the test machine. The test fixture is of course a three dimensional object and FIGS. 2 and 3 show only the two dimensions of the drawing plane. The test fixture will thus have test probes in the third dimension as well. The spacing between the lower ends of the test probes along distance X is therefore regular and even, and matches the spacing of contacts on the test machine. On the other hand, the opposite upper distal ends of test probes 32 extending upwardly through top plate 12 are in the image pattern. That is, these ends of the test probe are in a mirror image of the selected test points of a component or mounting location on a circuit board. This smaller distance relative to distance X is represented schematically by distance Y. The oblique angles at which the test probes are arranged depends upon the pitch and density of the particular component that is being translated, the location of the component on the board, and other factors such as neighboring components and the pattern into which the image pattern will be translated. There is no reason why the image pattern, when translated into the grid pattern, needs to be translated into a grid pattern that is simply an enlarged mirror image of the image pattern. The only requirement is that the grid pattern has the proper grid spacing for the test machine. In other words, the spacing and arrangement of the test contacts in the image pattern need not be translated into a mirror image in the grid pattern (in which the image pattern is enlarged). This may be seen in the different hole array arrangements between hole array 20 and the corresponding hole array 20' in FIG. 1. These two arrays have the identical number of holes but the holes are arranged in somewhat different patterns. The grid pattern of hole array 20' is thus not simply an enlarged mirror image of the image pattern of hole array 20. Nonetheless, the holes in the grid pattern have the regular grid spacing necessary for interfacing with the test machine.

As the pin tilt of any given test probe increases from perpendicular toward the horizontal test plane, the lower distal end of the probe will move closer to the lower surface of bottom plate 14. This is shown by distance Z in FIG. 2, which is the difference in the distances that the ends of probes 32 extend past the lower surface of the bottom plate. As the tilt angle of the test probes increases, so then does distance Z. When the tilt angle gets too large there can be problems in the integrity of the physical connection between the ends of the test probes and the interconnections with the test machine. It is therefore preferable to minimize the angular deflection of the test probes from perpendicular to the plane defined by the test fixture plates. FIG. 2 also illustrates a pair of test probes 34 that are oriented at right angles to the horizontal plane of the test plates.

The opposite distal ends of the test probes extend through the top and bottom plates, respectively, to make the electrical connection between the board under test and the test equipment. When a circuit board is to be tested, the board is oriented adjacent the top plate. Each test probe extending through the bottom plate is connected to the test machine with standard interconnects such as press-on spring connectors that as described below provide a pressure-transmitting mechanism along the longitudinal axis of the probes. The test probes are physically urged into connection with the test points on the board under test such that the test probes probe the associated test points in the net list and make an electrical connection. In other words, for each test point in the board under test there is a test probe. The upper distal end of a test probe makes an electrical connection with its associated test point. The lower distal end of the test probe is electrically connected with an associated test contact on the grid of contacts in the testing machine. This electrical interconnection between the test points and the testing machine is repeated for each test point in the board under test. With all of the electrical connections complete in the manner just described, the computerized testing begins with the testing machine transmitting test signals through the test probes and thus to the test points in the board.

Universal Grid Interface

The universal grid interface assembly 36 (UGI) of the present invention is illustrated in FIGS. 2 and 3 as being one part of a test fixture 10 that also includes standard test probes 32, 34. The UGI assembly is designed to translate the test points associated with a selected IC component or combination of IC components. The UGI assembly is used in situations where translation of the test points is either impossible with standard test probes, for example due to interference with the test probes used to translate adjacent components, or where it is more convenient to translate a given component with a separate translator. In this sense the UGI assembly of the present invention may be seen as a test fixture that may be used within a standard test fixture. The UGI is designed for a specific IC component package or pitch, such as a specific BGA or CSP, and the associated component mounting locations on boards or otherwise for selected test points on the board. That is, the UGI is unique to a specific IC component package or pitch and may be used to translate the test points associated with that component or pitch where ever it might be used, and in what ever kind of board in which it might be use.

The UGI may be removed from one test fixture and installed in another test fixture for testing boards that include a component or components having the same pitch as the UGI. For instance, a UGI designed for a component having a 0.2 mm pitch and a density of 900 may be used with any component having the same pitch, so long as density of the component is less than 900. Furthermore, multiple UGI assemblies may be used in a single test fixture.

As one aspect of the invention, the UGI assembly 36 of the present invention comprises several component parts, including a plurality of test probes 38, a test probe receiving block 40, a support block 42 that underlies receiving block 40. As another aspect of the invention, the UGI utilizes a flexible circuit interconnect, called "flex" 46. A retaining sheet 44, well known in the art, may be used in a position overlying the receiving block. As may be seen in FIGS. 2 and 3, the plurality of test probes 38 are generally oriented at right angles to the horizontal plane of the plates in the test fixture. In FIGS. 2 and 3 a portion of the guide plates has been cut away to expose components of the UGI. In FIG. 3 a portion of the bottom plate has similarly been cut away to expose components of the UGI. As more thoroughly detailed below, the test probes of the UGI preferably are arranged in the image pattern and preferably do not vary from that pattern, although in some instances the test probes could have some degree of pin tilt. The UGI relies upon the flex 46 to translate the image pattern to the grid pattern.

UGI 36 includes a test probe 38 for each selected test point in the image pattern of the component that the UGI is translating. As noted, the UGI is generally used to translate a selected number of test points on a circuit board, for instance a single component. The test probes 38 are shorter than standard test probes such as 32 and 34. Since the UGI is designed to translate components such as BGA and CSP packages that have high densities, the test probes also have very small diameters, often down to 0.2 mm, though the diameter will vary with the size of the test point that is being probed. With the UGI a plurality of holes is drilled through the top plate of the test fixture in the image pattern of the selected test points associated with a specific component that is being translated with the UGI. An identical plurality of holes is drilled through each successively adjacent guide plate through which the test probes extend. In FIGS. 2 and 3, guide plates 16a, 16b and 16c are drilled with an identical image pattern or array of test probe holes. The image pattern of holes is drilled in each plate such that when the test fixture is assembled (as shown in FIG. 1), all of the holes in each plate precisely align with the corresponding and associated holes in adjacent plates.

Test probe receiving block 40 similarly has an identical plurality of holes 48 (FIGS. 4 and 5) drilled through it in the image pattern of the component that the UGI is translating. As detailed below, a test probe 38 is inserted into each test probe hole in the plates and is received into each corresponding and associated hole 48 in receiving block 40.

The number of holes 48 in the test probe receiving block may be greater than the number of selected test points in the image pattern that is being translated with the UGI. Thus, depending upon the type of component that is being translated, not all of the holes in the receiving block may be necessary for electrical interconnection with a test point. Stated otherwise, the component under test that is being translated with the UGI may have fewer test points than the number of holes 48 that are available in the block. Thus, the UGI is capable of translating any component with test points having the same pitch as the holes 48 drilled in receiving block 40 and a density that is less than or equal to the density of the holes 48 in receiving block 40.

A support block 42 underlies receiving block 40 and is provided to orient receiving block 40 in the test fixture, align it properly and to hold it in position. Support block 40 may be fixed to the test fixture, for instance with a screw (not shown) threaded through the bottom plate and into the block. Both support block 42 and receiving block 40 are readily removable from the test fixture so that these components may be used in other test fixtures.

In FIGS. 2 and 3 retaining sheet 44 is shown overlying the upper surface of receiving block 40. Retaining sheet 44 is made of a rubber material such as latex, or a fine-mesh nylon or spandex material, and functions to hold the test probes in place in the assembled test fixture and prevent the probes from sliding out of the test fixture. The position of the retaining sheet is not important. For instance, it could be placed between guide plates 16a and 16b. As also shown in FIGS. 2 and 3, support block 42 and receiving block 40 are attached to bottom plate 14. The test fixture is a 3-dimensional grid. The support block and the receiving block may be located at any level in this grid. As an example, the receiving block and support block could be moved upwardly toward the board under test onto any of the guide plates. This opens up the area below the receiving block, which allows for nearby components on the board under test to be translated with standard test probes with an increased angle of pin tilt. Moreover, where the diameter of the test pins 38 is very small it may be advantageous to include additional support blocks in locations between the top plate and the receiving block. Such support blocks would of course have holes drilled in the image pattern to guide the test pins and to support them.

As described fully below, one end of flex 46 is sandwiched between receiving block 40 and support block 42. The area of flex that is sandwiched between these two blocks is referred to as pad 50. The opposite end of flex 46 is similarly sandwiched between a pair of blocks 52 and 54. The area of flex that is sandwiched between these two blocks is referred to as pad 56. As detailed below, the pattern of electrical contacts on pad 50 matches the image patterns and the pattern of electrical contacts on pad 56 matches the grid pattern of the test machine.

Figure 4:
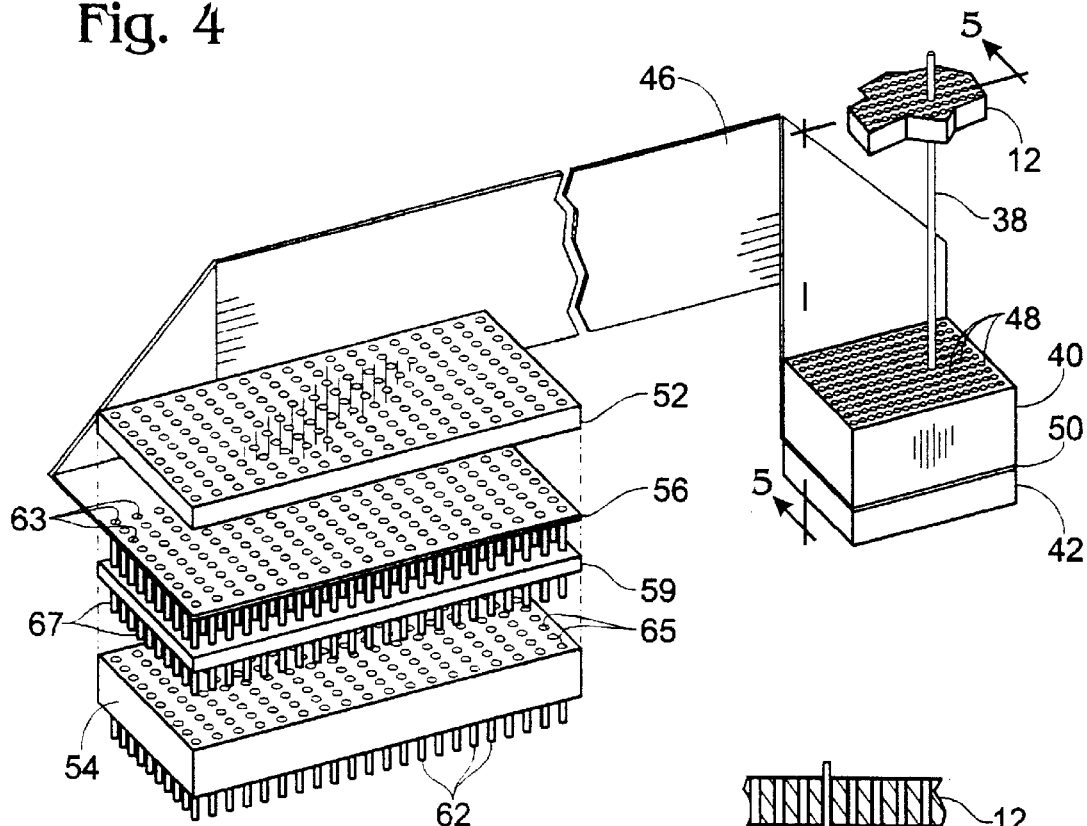
FIG. 4 is a partial fragmentary, perspective view of a portion of the UGI of the present invention, including the flex, showing the grid pattern end of the flex assembly exploded.

FIG. 4 illustrates a single test probe 38 extending through a test probe hole in top plate 12 and into a corresponding and associated test probe receiving hole 48 in receiving block 40. Receiving block 40 has an associated hole 48 for each selected test point in the image pattern that is being tested, although as noted above the number of holes 48 may be greater than the number of test points in the component under test. Each hole 48 extends completely through the receiving block. As detailed above, top plate 12 and each guide plate between receiving block 40 and the top plate will have an identical array of test probe holes, one for each associated test point in the image pattern. Each image pattern hole in each plate will have an associated hole in the receiving block, and each hole in each plate is aligned with the associate hole in the next adjacent plate or plates.

An electrically conductive spring 58 is held in each hole 48 in receiving block 40. The arrangement of springs 58 in receiving block 40 is detailed in FIG. 9. The lower portion of each hole 48 has a larger counter bored portion 49 that defines a shoulder 51. The diameter of springs 58 is smaller than the diameter of the holes in the counter bore, but larger than the diameter of the holes above the counter bore above shoulder 51. The springs are thus held in the counter bored portion of holes 48 under a pre-loaded compression such that the upper end of the spring abuts shoulder 51 and an contact 53 at the opposite end of spring 58 abuts an electrical contact 55 in pad 50. As described more fully below, the lower distal ends of probes 38 make electrical contact with the upper end of springs 58, urging contacts 53 under compressive force against associated contacts 55 on flex 46 such that an electrical connection is established between probes 38 and the associated contacts 55 in pad 50.

The test probes 38 used in UGI 36 typically have very small diameters, down to 0.2 mm, and are therefore quite delicate. The test probe holes in the plates and the test probe receiving holes 48 in the receiving block are drilled slightly larger than the size of the test probe that will extend through the holes, but to a very close tolerance. The receiving block 40 is relatively thicker than the guide plates and the top and bottom plates. Holes 48 in the receiving block thus help support the probes.

The test probe receiving holes drilled through block 40 are arranged in the image pattern or pattern that matches the pitch of the selected test points associated with the component that is being translated with the UGI. The image pattern shown in FIGS. 4 and 5, as illustrated by the holes 48 in the receiving block, has a regular array of ten rows of holes, each row having eighteen holes. This particular image or pitch pattern might be typical of, for instance, some BGA packages. Of course, the image pattern, density and pitch can vary widely, depending upon the test points associated with the component.

Figure 5:
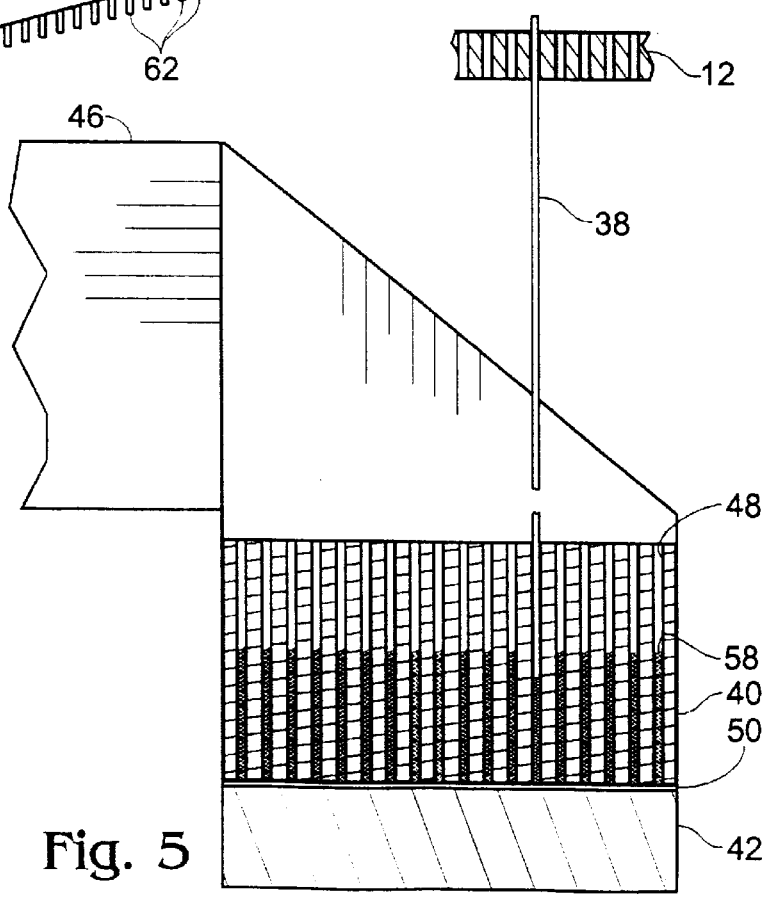
FIG. 5 is a sectional view of the base of the UGI taken along the line 5—5 of FIG. 4.
Figure 6:
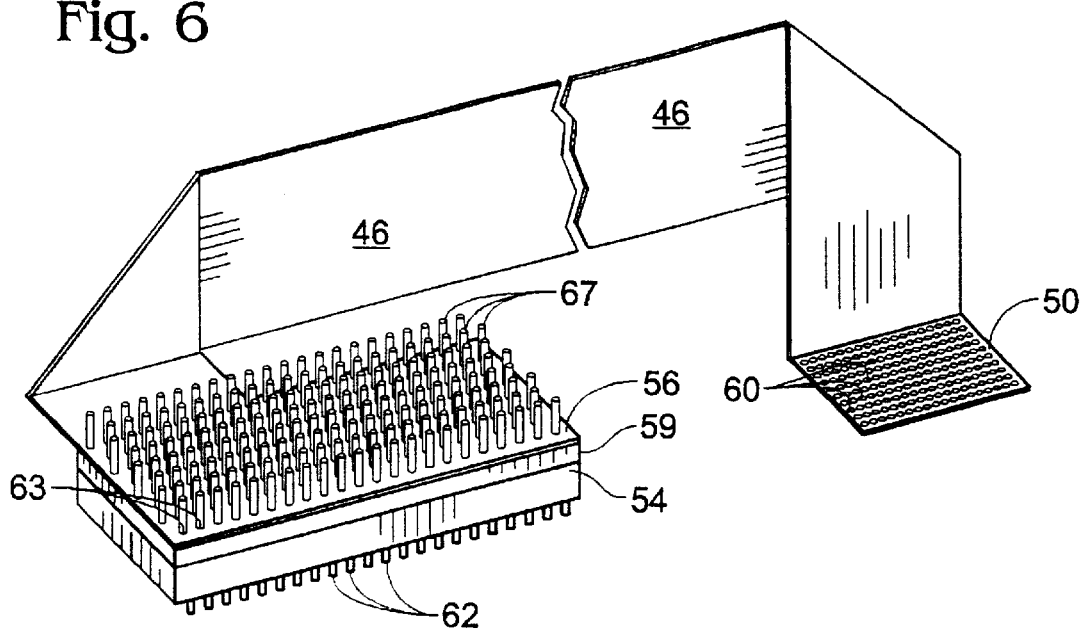
FIG. 6 is a perspective view of the flex used in connection with the present invention with some of the components that are used to make the electrical interconnection with the test machine.

FIG. 6 illustrates flex 46, and in particular, pads 50 and 56. Flex 46 is a shielded flexible circuit interconnect having a plurality of electrical leads or traces running along its length. The flex is a flexible, pliable, ribbon-like material that may be folded, bent and shaped back over onto itself along its length many times in a multitude of different configurations, a few of which are shown in FIGS. 4, 5 and 6. Many different types of flex may be used in the UGI of the present invention, including single-sided, double-sided and multi-layer products, depending upon the number of electrical leads needed in a particular situation. Flex of the kind used in the UGI of the present invention is available from various manufacturers of flexible circuits, including Sheldahl, Inc. of Northfield, Minn., and Adflex Solutions, Inc. of Chandler, Ariz.

Each lead or trace in the flex is shielded to electrically isolate it from adjacent traces. The flex has an outer dielectric layer which will protect the traces in the flex from electrically interfering with other test probes in the test fixture when the UGI is assembled.

Pads 50 and 56 comprise contact areas for making an electrical connection between the test probes (via springs 38) on the one end (at pad 50) and the circuit board test machine on the other end (at pad 56 via posts 67). Pad 50 has a plurality of contacts or contact points 60 arranged in the image pattern. Thus, the arrangement of contact points 60 of pad 50 corresponds to the arrangement of the 180 holes 48 in the image pattern in question. For each contact 60 there is an associated test probe receiving hole 48 in the receiving block. Each contact 60 is an electrical contact that has an electrical lead or trace leading from the contact through the length of the flex and terminating at an associated contact 63 at the opposite end of the flex, at pad 56.

Figure 9:
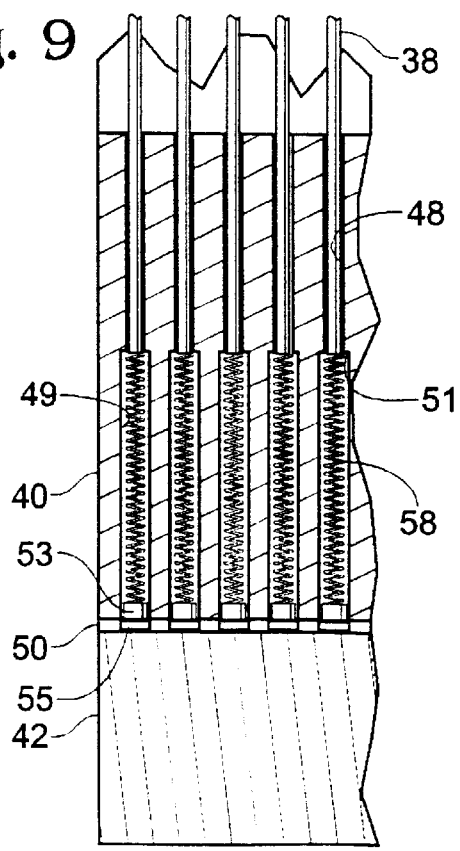
FIG. 9 is a partial fragmentary perspective view of the base of the UGI of FIG. 8, taken along the lines 9—9 of FIG. 8 and showing the electrical interconnections between the test probes in the UGI and the associated electrical contacts on the flex.

As shown in FIG. 9, each contact point 60 at has an electrical contact 55 for making the electrical connection with the associated spring 58 in the assembled UGI. Each contact point 60 is electrically connected to a discrete trace. The contact points 60 and the associated traces leading from each contact point may be arranged in pad 50 in an essentially three dimensional spatially oriented arrangement in which the traces leading from each contact point and into the flex are oriented above one another or adjacent one another where necessary to insure that the contact points and traces are electrically isolated from one another and so that there is no electrical interference. In other words, electrical signals running over one trace will not electrically interfere with, for instance, other test probes.

At the opposite end of the flex, at pad 56, there are an identical number of contact points 63 (i.e., 180) (also called "plated through holes"), each of which is electrically connected to a corresponding and associated contact 60 at pad 50 through an associated trace. But unlike the contact points 60 at pad 50, which are in the image pattern, contact points 63 at pad 56 are arranged in the grid pattern of the test machine. The contact points 63 comprise vias or plated through holes that extend through pad 56. Since the plated through holes are arranged in the grid pattern, flex 46 thus translates the image pattern of the selected test points associated with the component being translated into the grid pattern of the test machine. Regardless of how flex 46 is folded over onto itself, the electrical association and continuity between contact points 60 of pad 50 is maintained with contact points 63 of pad 56.

The electrical interconnection between the test machine and the contact points 63 of pad 56 is illustrated in the exploded illustration of FIG. 4. A support block 54 has a plurality of electrical posts 62 arranged in the grid pattern extending through its lower surface. Each post 62 comprises a male post that electrically interconnects with the test machine in a standard fashion. Each post 62 also has an electrically associated female plug-in connector, accessible through the upper surface of block 54, and shown with reference number 65. An adapter block 59 having a like plurality of posts 67 extending through both the upper and lower surface of the block lies between block 54 and block 52. The posts 67 plug in to the associated female plug-in connectors in block 54 by insertion of the male posts into the connectors. As noted, pad 56 includes a plurality of plated through holes 63. Pad 56 is assembled with adapter block 59 such that posts 67 are inserted into the associated plated through holes 63 in the pad, thus making an electrical connection between the posts and each associated plated through hole. Block 52 is then assembled with the remaining components such that the pad is sandwiched between blocks 52 and 54 with the proper electrical connections established at the test machine end of the UGI. This is illustrated in FIG. 6 where block 52 is removed, and in FIG. 7 where block 52 is shown in the assembled position.

Flex 46 may in essence be described an apparatus for getting electrical test signals into and out of the test points in a test fixture. The test probe receiving block may be located at any position in the test fixture, depending upon the location of the component or test points to be translated. Multiple UGIs and thus multiple receiving blocks may be used in a single test fixture. Since in most instances there will be many other standard test probes also used in the test fixture, the flex must not interfere with the other test probes, either physically or electrically. Flex 46 may be folded onto itself in many different orientations such that it may, as shown in FIGS. 1 and 2, be threaded in a ribbon-like fashion through and between other test probes, since the flex is very thin. As an example, flex 46 is shown in FIG. 3 interwoven between probes 64, 66. In an actual test fixture the flex would be interwoven through and between perhaps hundreds of test probes. In this way the signals from the test probes in the UGI are translated to a location remote from the actual position of the test points being translated, for interfacing with the test machine. The grid pattern end of flex 46 (i.e., at pad 56) may be located at any convenient position, either within the test fixture as shown in FIG. 1, or outside of the confines of the test fixture as shown in FIG. 2.

Figure 7:
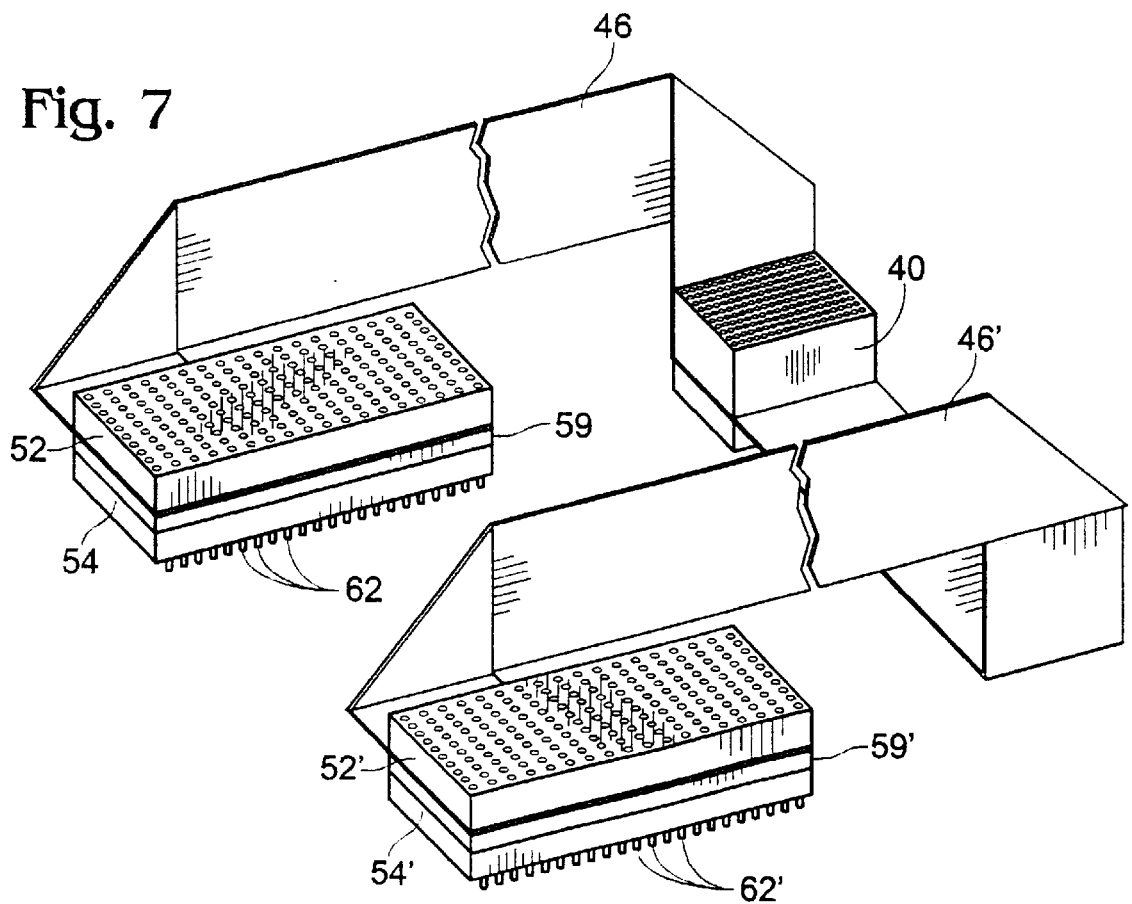
FIG. 7 is a schematic view of a UGI showing the use of multiple flex traces to translate the image pattern to the grid pattern.

As noted above, some IC packages have extremely high densities, up to 900 test points per component, packed into an area of 35 mm$^2$. In some instances it may be necessary to utilize two or more flex harnesses to translate all of the test points. FIG. 7 illustrates a UGI using a flex having two flex circuits 46 and 46' with a single test probe receiving block. In this embodiment each flex circuit 46 and 46' translates ½ of the test points in the image pattern, which in this case comprises 180 test points. Flex 46 thus translates 90 test points from the image pattern into the grid pattern, and flex 46' translates the remaining 90 points. Each "branch" of the flex in this case thus has fewer leads running through it, and there are correspondingly fewer contact points on each pad. The contact points on each pad are sandwiched between blocks 52, 54, and 52', 54', as described above. However, the number of posts 62 and 62' associated with blocks 54 and 54' will be ½ the number of posts required if a single flex were used (FIG. 6).

It is possible to use more than two flex circuits with a single UGI receiving block. For instance, up to four separate flex circuits may be used to translate a component having a high density, one flex circuit leading out of each of the four lateral sides of the receiving block 40. Such flex circuits may be manufactured such that the pads 50 are physically connected if desired to ease assembly.

Assembly and Use

A test fixture utilizing a UGI according to the present invention is assembled in a manner similar to standard test fixtures. Each of the plates is predrilled with test probe holes in the appropriate positions for the board under test, and such that the holes in one plate align with the associated holes in the next adjacent plate, or plates as the case may be. In locations where a UGI is to be used, the test probe holes associated with the UGI are all drilled in the image pattern in all of the plates through which the probes will extend. The number of such plates depends upon the location of the support block and receiving block in the test fixture, as noted above. The number of test probe holes for the UGI corresponds to the number of selected test points that will be translated with the UGI. The supporting block 42 is attached to one of the plates in the position associated with the test points being translated with the UGI. In FIGS. 2 and 3 the supporting block is shown attached to lower plate 14. However, as described above the supporting block could just as well be positioned on one of the guide plates 16.

Figure 8:
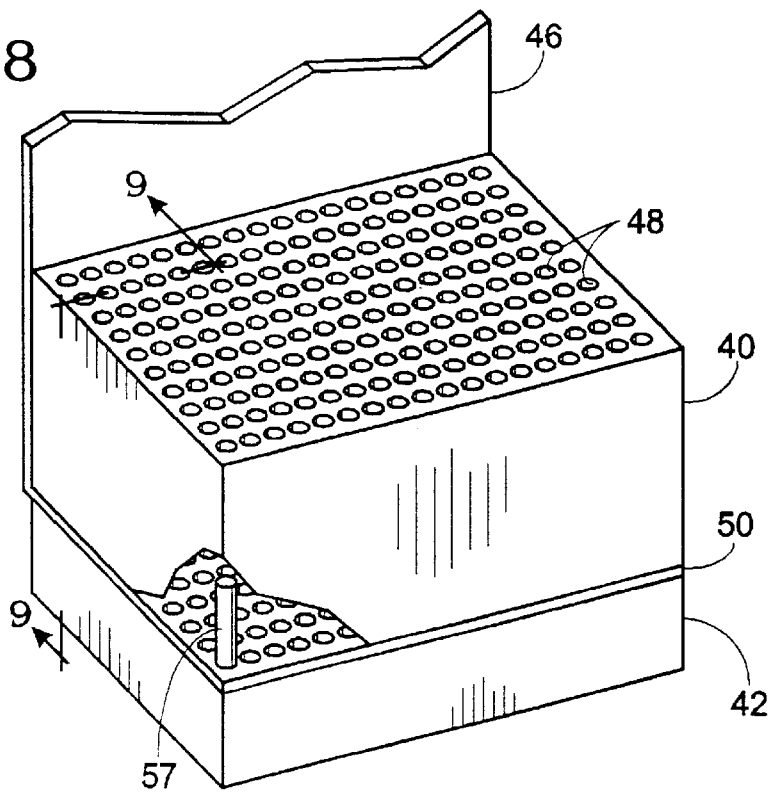
FIG. 8 is a close up, partially cut away perspective view of the base of the UGI shown in FIG. 4, illustrating locator pins that position the flex pad on such that the proper electrical connections are established.

As shown in FIG. 8, alignment pins 57 are provided in support block 42 (only one of which is shown). The alignment pins extend through alignment holes in pad 50 and into associated alignment holes in receiving block 40 to insure that the correct electrical association between test probes in the image pattern and contact points 60 is maintained. In this way each hole 48 in receiving block 40 communicates with the underlying associated contact point 60 in pad 50. The pad 50 is then assembled with the receiving block 40 and aligned with alignment pins 57 (FIG. 8) such that each hole 48 in the receiving block lies directly over and communicates with the associated contact point 60 in the pad. The positioning and number of the alignment pins is not important so long as they function to maintain alignment of the test probes and the contact points. As shown in FIG. 8 the alignment pins can be positioned such that they are inserted into a hole 48 in the receiving block. In this instance the hole 48 would be an unfilled hole—that is, a hole that is not part of the net list of test points being translated. Alternately, the alignment pins could be positioned outside of the image pattern. With the components thus aligned, the receiving block is then fixed to the supporting block with pad 50 sandwiched between the two blocks, and in a position such that a discrete electrical connection may be made with the lower distal end of each test probe and the associated contact point 60 on pad 50.

Retaining sheet 44 is put in place and the remainder of the guide plates are stacked in place and connected to separator posts. A retaining sheet will also be used for all other test probes used in the test fixture.

At this point the test probes may be inserted into the test probe holes. The test probe holes are drilled to the proper diameter for the test probes used to probe the test points on the component or component mounting location being tested. Appropriately sized test probes are inserted into the test probe holes drilled through the top plate. Because the plates are precisely aligned and the holes in each adjacent plate are precisely drilled and located, the test probes slide easily through the associated holes in each adjacent plate. The probes are pushed through the retaining sheet and are thus held in place, supported and guided by the plates in the fixture.

The lower distal ends of test probes 38 in the UGI are inserted into the test probe holes in the top plate and downwardly through the guide plates and into the associated test probe receiving holes 48 in the receiving block 40. Test probes 38 are of a length that allows them to contact and slightly depress springs 58, yet the upper distal ends remain extended slightly above top plate 12, as shown in FIG. 1. FIG. 5 illustrates a single test probe 38 received in the associated hole 48 in receiving block 40, slightly depressing spring 58.

The fixture is ready for use with all of the test probes thus inserted into the fixture. The electrical connections between the test machine and the conventional test probes and the UGI-translated probes are made—each test point in the image pattern is translated to an associated test contact in the grid pattern. The board under test is then positioned adjacent the top plate of the test fixture such that each test probe contacts the associated test point on the board to make an electrical connection. Pressure is applied to the board, urging it into contact with the probes on the test machine. As noted, the conventional test probes in the fixture are interfaced with the test machine with standard connectors such as spring connectors (not shown). These spring connectors provide a resilient force along the longitudinal axis of the probe, resiliently urging the probes into contact with the associated test points. With the UGI, the ends of the test probes make an electrical connection with the selected associated test points. Pressure applied to the board in the direction of the test fixture exerts pressure against the test probes 38, which forces the probes downwardly against springs 58, causing a like resilient compressive force to be exerted along the longitudinal axis of the probe and causing the springs in the receiving block to make electrical contact with the associated contact points 60 in pad 50. With a full electrical connection made between all test points and the test machine, the machine begins the routine of sending signals to the board and verifying the functioning of the circuits.

Each test probe in the UGI is electrically and physically associated with a specific test point of the selected test points that the UGI is translating. Thus, with reference to a single test probe in the UGI, the upper distal end of the test probe makes a physical and electrical connection with a specific test point on the circuit board under test. The lower distal end of that test probe is electrically connected to an associated test point contact 60 is pad 50. A trace leads from that test point contact to an associated test point contact 63 at pad 56. Finally, there is an electrical connection between that test point contact 63 and an associated test contact in the testing machine. This electrical association between test points in the image pattern and associated test points in the grid pattern, and correct orientation of the associated points relative to one another, is maintained throughout all of the selected test points and through the UGI.

As noted, in most instances the test probes of the UGI are oriented in the image pattern and they do not vary from that pattern. In other words, the in most instances the test probes do not have any pin tilt. However, the UGI according to the present invention may be built with some degree of pin tilt if desired. The UGI will still be able to translate any component having the same pitch as the component under test for which the UGI is prepared, provided the density of the component is less than or equal to the density of the UGI. In this instance the pattern of contact points on the first end of the flexible circuit interconnect (i.e., at pad 50), will not be in the image pattern. Nonetheless, the pattern of contacts at the second end of the interconnect will be in the grid pattern.

While the present invention has been described in terms of a preferred embodiment, it will be appreciated by one of ordinary skill that the spirit and scope of the invention is not limited to those embodiments, but extend to the various modifications and equivalents as defined in the appended claims.

What is claimed is:

1. A method of testing a selected plurality of test points on a printed circuit board having a plurality of test points greater than the selected plurality, the selected plurality of test points arranged in an image pattern, the method utilizing a test fixture assembly having a plurality of spaced apart parallel plates defining a plate plane, wherein a plurality of test probes arranged in the image pattern extend through a plurality of said plates in a direction generally transverse to said plate plane and a first end of each test probe is in a position to make an electrical connection with an associated test point of the selected plurality, the method comprising the steps of:

translating said image pattern of the selected plurality of test points into a grid pattern of a circuit board testing machine that is different from said image pattern, wherein said image pattern is translated into said grid pattern with a flexible circuit interconnect having a plurality of first test point contacts at a first end thereof and a plurality of associated second test point contacts at a second end thereof arranged in the regular grid pattern, each first test point contact at the first end of the flexible circuit interconnect electrically connected to an associated test probe, and each second test point contact at the second end of said flexible circuit interconnect electrically connected to and associated with the said associated first test point contact at the first end of said flexible circuit interconnect.

2. The method of claim 1 in which the plurality of first test point contacts at the first end of the flexible circuit interconnect is arranged in the image pattern.

3. The method of claim 1 in which the flexible circuit interconnect is capable of being folded onto itself in a plurality of orientations while maintaining the association between the plurality of first test point contacts and the plurality of second test point contacts.

4. The method of claim 1 in which each test probe includes a first distal end and an opposite distal end, and wherein the first distal end of each test probe is positioned for making an electrical connection with an associated test point on the printed circuit board, and the opposite distal end of each test probe is positioned for making an electrical connection with an associated test point contact at the first end of the flexible circuit interconnect.

5. The method of claim 4 in which each test point contact of said plurality of test point contacts at said first end of said flexible circuit interconnect is electrically interconnected to an associated test point contact at said second end of said flexible circuit interconnect, and each test point contact at said second end is electrically interconnected with an associated test contact in said circuit board testing machine.

6. The method of claim 5 in which the electrical interconnections between each test point contact at the second end of the flexible circuit interconnect and the circuit board testing machine is made in a position remote from the location of said first end of said flexible circuit interconnect.

7. The method of claim 6 in which the electrical interconnections between each test point contact at the second end of the flexible circuit interconnect and the circuit board testing machine is made in the test fixture.

8. The method of claim 7 in which the electrical interconnections between each test point contact at the second end of the flexible circuit interconnect and the circuit board testing machine is made outside of the test fixture.

9. In a test fixture for testing a printed circuit board having a first plurality of test points arranged in an image pattern on a surface of the board, the test fixture of the type having a plurality of spaced apart parallel plates defining a plate plane, the improvement comprising:

a plurality of electrically conductive test probes extending through a plurality of said plates in a direction generally transverse to said plate plane, the test probes each having a first and a second end, and arranged in the test fixture such that the first end of each test probe is adapted for making an electrical connection with an associated test point on said printed circuit board; and a flexible circuit interconnect having a plurality of contacts at a first end thereof, said first end of said flexible circuit interconnect positioned relative to the plurality of test probes such that the second end of each test probe in said plurality of test probes is positioned for making an electrical connection with an associated contact at said first end of said flexible circuit interconnect, said flexible circuit interconnect having a second end having a plurality of contacts arranged in a regular grid pattern that is different from said image pattern, each of said contacts at said second end of said flexible circuit interconnect being electrically interconnected to and associated with a corresponding contact at said first end of said flexible circuit interconnect.

10. The test fixture of claim 9 in which the flexible circuit interconnect is capable of being folded onto itself in a multitude of orientations while maintaining the electrical connection and association between the plurality of contacts at the first end of said flexible circuit interconnect and the plurality of contacts at said second end of said flexible circuit interconnect.

11. The test fixture of claim 10 in which each contact at said second end of said flexible circuit interconnect is electrically connected to an associated test point in a printed circuit board testing machine having a plurality of test points arranged in the grid pattern.

12. The test fixture of claim 11 in which the electrical interconnections between said second end of said flexible circuit interconnect and said associated test points in said printed circuit board testing machine are in a position remote from said first end of said flexible circuit interconnect.

13. The test fixture of claim 11 in which the electrical interconnections between said second end of said flexible circuit interconnect and said associate test points in said printed circuit board test machine are in the test fixture.

14. The test fixture of claim 12 including a second plurality of test probes extending through a plurality of said plates in a direction generally transverse to the plate plane, and wherein the flexible circuit interconnect is routed past said second plurality of test probes without electrically interfering with them.

15. The test fixture of claim 9 further including a test probe receiving block having a plurality of test probe receiving holes extending therethrough, said test probe receiving block interposed between said first end of said flexible circuit interconnect and said printed circuit board such that each of said test probe receiving holes communicates with an associated contact at said first end of said flexible circuit interconnect.

16. The test fixture of claim 15 in which said second ends of said test probes are received into an associated test probe receiving hole in said test probe receiving block.

17. The test fixture of claim 15 in which an electrically conductive spring is contained in each test probe receiving hole in said test probe receiving block, and wherein each of said springs is interposed between said second ends of said test probes and said contacts at said first end of said flexible circuit interconnect.

18. A universal grid interface for translating the image pattern of a selected plurality of test points of a printed circuit board having a plurality of test points that is greater than the selected plurality into a grid pattern that is different from the image pattern, comprising:
   a test fixture having a top plate, a bottom plate and plurality of spaced apart parallel guide plates between the top plate and the bottom plate, said plates defining a plate plane;
   a plurality of test probe holes through at least the top plate;
   a test probe for each test point of the selected plurality, each of said test probes extending through a test probe hole through at least the top plate in a direction generally transverse to the plate plane, each test probe having a first end and a second end, the first end configured for making an electrical connection with a selected test point in the selected plurality of test points in the printed circuit board;
   a test probe receiving block having a plurality of test probe receiving holes therethrough, the number of test probe receiving holes in the receiving block being equal to or greater than the number of test points in the selected plurality, the test probe receiving block being removably mounted in the test fixture interposed between the top plate and the bottom plate and in a position such that there is a receiving hole in the receiving block associated with a test probe hole such that the second end of each test probe is received into the associated receiving hole; and
   a flexible circuit interconnect having a plurality of contacts on a first end thereof, one of said contacts for each of said test points in the selected plurality, the first end of the flexible circuit interconnect positioned adjacent the test probe receiving block such that the second end of each test probe is in electrical contact with an associated contact on the first end of the flexible circuit interconnect.

19. The universal grid interface of claim 18 wherein the second end of each test probe is electrically connected to an associated test point of a printed circuit board testing machine.

20. The universal grid interface of claim 19 including a plurality of electrically conductive leads, each lead having a first and second end, the second end of each test probe having a first end of a lead electrically connected thereto, and the second end of each lead connected to an associated contact in a printed circuit board testing machine, wherein each test point in the printed circuit board is electrically associated with a contact in the printed circuit board testing machine.

21. The universal grid interface of claim 18 in which the test probe receiving holes in the test probe receiving block are arranged in the image pattern.

22. The universal grid interface of claim 18 wherein the flexible circuit interconnect has a second end having a plurality of contacts, one of said contacts for each of said test points in the selected plurality, each of said contacts electrically connected to an associated contact at the first end of the flexible circuit interconnect.

* * * * *